(12) United States Patent
Kang et al.

(10) Patent No.: US 8,735,910 B2
(45) Date of Patent: May 27, 2014

(54) LIGHT-EMITTING DEVICE

(75) Inventors: Dae Sung Kang, Seoul (KR); Myung Hoon Jung, Seoul (KR); Sung Hoon Jung, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 393 days.

(21) Appl. No.: 12/964,374

(22) Filed: Dec. 9, 2010

(65) Prior Publication Data

US 2011/0140132 A1   Jun. 16, 2011

(30) Foreign Application Priority Data

Dec. 10, 2009   (KR) .................. 10-2009-0122752

(51) Int. Cl.
*H01L 29/18*   (2006.01)

(52) U.S. Cl.
USPC ..................... 257/88; 257/E33.012; 438/29

(58) Field of Classification Search
USPC ................ 257/79, 80, 81, 88, 96, 431, 448, 257/E33.001, E33.005, E33.008, E33.012, 257/E33.025, E33.03, E33.044, E33.047, 257/E33.066; 438/29, 34, 35, 39, 46, 47
See application file for complete search history.

(56) References Cited

U.S. PATENT DOCUMENTS

| | | | |
|---|---|---|---|
| 7,560,738 B2 | 7/2009 | Liu | |
| 8,003,974 B2 * | 8/2011 | Heidborn et al. | 257/13 |
| 2006/0255343 A1 | 11/2006 | Ogihara et al. | |
| 2009/0008668 A1 | 1/2009 | Matsumura | |
| 2009/0078955 A1 * | 3/2009 | Fan et al. | 257/98 |

FOREIGN PATENT DOCUMENTS

| | | |
|---|---|---|
| CN | 1913180 | 2/2007 |
| CN | 101263610 | 9/2008 |
| CN | 101335287 | 12/2008 |
| CN | 101459209 | 6/2009 |
| JP | 56-18483 A | 2/1981 |
| JP | 56-126985 A | 10/1981 |
| JP | 59-058877 | 4/1984 |
| JP | 2007-273897 | 10/2007 |
| KR | 10-2008-0006160 A | 1/2008 |
| WO | 2006/043796 A1 | 4/2006 |
| WO | 2008/043324 A1 | 4/2008 |

* cited by examiner

*Primary Examiner* — Sonya D McCall Shepard
(74) *Attorney, Agent, or Firm* — McKenna Long & Aldridge LLP (57) ABSTRACT

Provided are a light-emitting device, a light-emitting device package, and a method for fabricating the light-emitting device. The light-emitting device includes a first light-emitting structure; an insulation layer having non-conductivity, in which a current does not flow, on the first light-emitting structure; a second light-emitting structure on the insulation layer; and a common electrode simultaneously and electrically connected to the first light-emitting structure and the second light-emitting structure.

18 Claims, 8 Drawing Sheets

FIG.15

# LIGHT-EMITTING DEVICE

CROSS-REFERENCE TO RELATED APPLICATIONS

The present application claims priority under 35 U.S.C. §119(a) of Korean Patent Application No. 10-2009-0122752 filed on Dec. 10, 2009, which is hereby incorporated by reference in its entirety as if fully set forth herein.

BACKGROUND

Light emitting diodes (LEDs) are semiconductor light-emitting devices that convert current into light. As luminance of LEDs has been recently increased, the LEDs are being used as light sources for displays, vehicles, and illumination. Also, LEDs emitting highly efficient white light may be realized by using a fluorescent substance or combining LEDs having various colors.

Since such a LED has general diode characteristics, when the LED is connected to an alternative current (AC) power source, the LED is repeatedly turned on/off according to a direction of the current. Thus, the LED does not continuously generate light. In addition, the LED may be damaged by the reverse current.

Thus, various researches are conducted in cases which an LED is directly connected to an AC power source to facilitate use of the LED.

SUMMARY

Exemplary embodiments may provide a light-emitting device having a new structure.

Exemplary embodiments may also provide a light-emitting device having an electrode structure, which is commonly connected to at least two light-emitting structures.

Exemplary embodiments may also provide a light-emitting device, which receives an AC power to continuously generate light.

In one exemplary embodiment, a light-emitting device includes: a substrate; a first light-emitting structure on the substrate, the first light-emitting structure including a first conductive type semiconductor layer, a first active layer on the first conductive type semiconductor layer, and a second conductive type semiconductor layer on the first active layer; an insulation layer on the first light-emitting structure, the insulation layer being disposed on the second conductive type semiconductor layer; a second light-emitting structure on the insulation layer, the second light-emitting structure including a third conductive type semiconductor layer on the insulation layer, a second active layer on the third conductive type semiconductor layer, and a fourth conductive type semiconductor layer on the second active layer; and a common electrode commonly and electrically connected to the second conductive type semiconductor layer and the third conductive type semiconductor layer.

In another exemplary embodiment, a light-emitting device includes: a conductive support member; a first light-emitting structure on the conductive support member, the first light-emitting structure including a first conductive type semiconductor layer on the conductive support member, a first active layer on the first conductive type semiconductor layer, and a second conductive type semiconductor layer on the first active layer; an insulation layer on the first light-emitting structure, the insulation layer being disposed on the second conductive type semiconductor layer; a second light-emitting structure on the insulation layer, the second light-emitting structure including a third conductive type semiconductor layer on the insulation layer, a second active layer on the third conductive type semiconductor layer, and a fourth conductive type semiconductor layer on the second active layer; and a common electrode commonly and electrically connected to the second conductive type semiconductor layer and the third conductive type semiconductor layer.

In further another embodiment, a light-emitting device includes: a substrate; a first light-emitting structure on the substrate; a common electrode layer on the first light-emitting structure; an insulation layer on the common electrode layer; a second light-emitting structure on the insulation layer; and a plurality of common electrodes passing through the insulation layer to contact a conductive type semiconductor layer of the second light-emitting structure.

The details of one or more exemplary embodiments are set forth in the accompanying drawings and the description below. Other features will be apparent from the description and drawings, and from the claims.

DETAILED DESCRIPTION OF THE EMBODIMENTS

Hereinafter, a light-emitting device, a light-emitting device package, and a lighting system according to exemplary embodiments will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
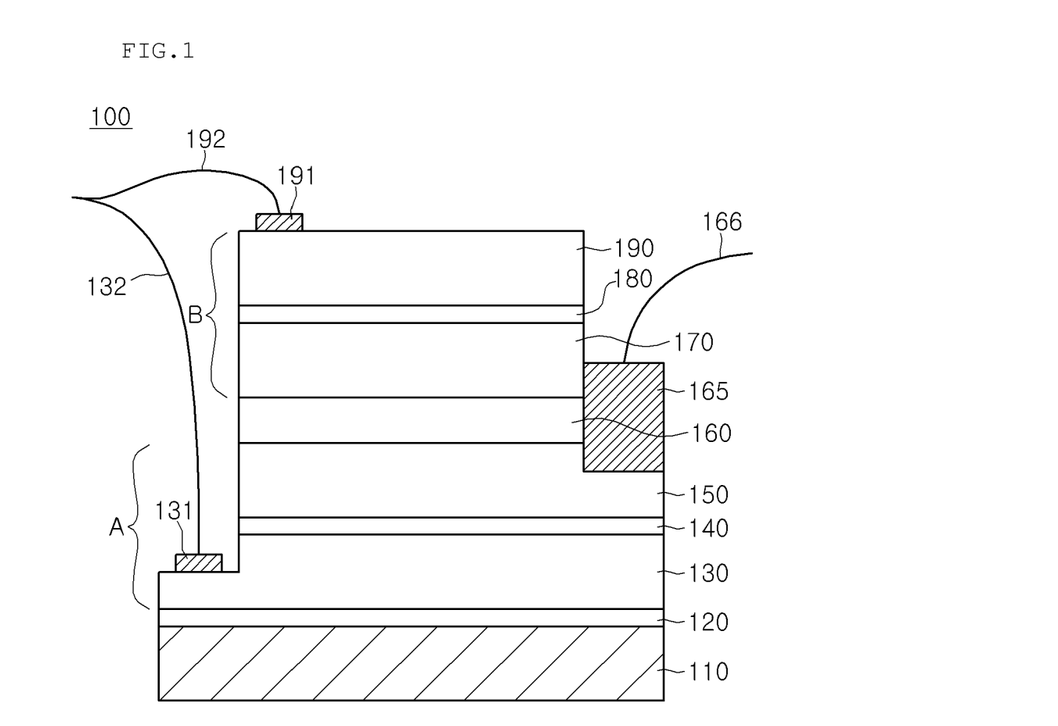
FIG. 1 is a sectional view of a light-emitting device according to a first exemplary embodiment.
Figure 2:
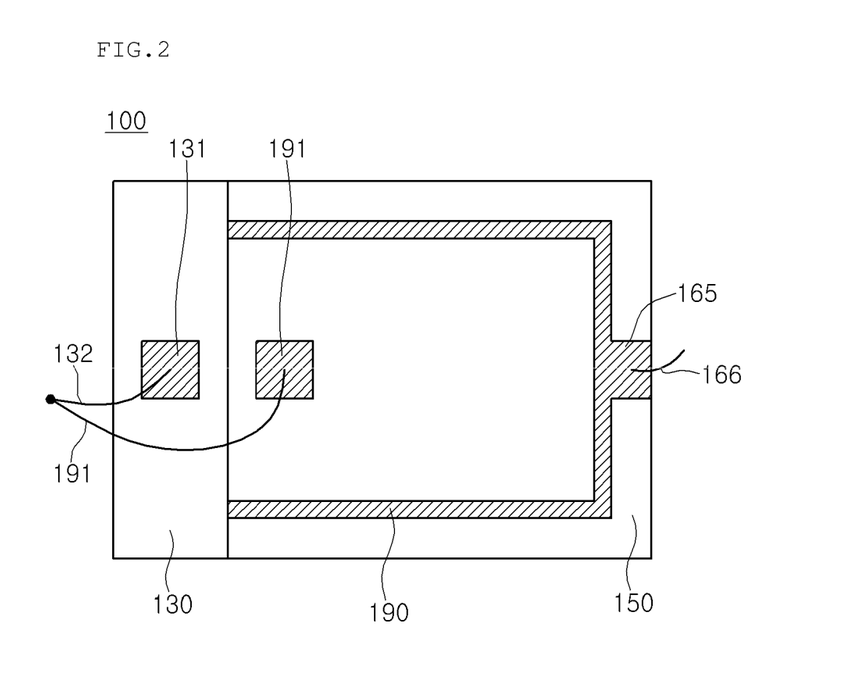
FIG. 2 is a plan view of the light-emitting device according to the first exemplary embodiment.

FIG. 1 is a sectional view of a light-emitting device according to a first exemplary embodiment, and FIG. 2 is a plan view of the light-emitting device according to the first embodiment.

Referring to FIGS. 1 and 2, a light-emitting device 100 may include a substrate 110, a base layer 120, a first conductive type semiconductor layer 130, a first active layer 140, a second conductive type semiconductor layer 150, an insulation layer 160, a third conductive type semiconductor layer 170, a second active layer 180, a fourth conductive type semiconductor layer 190, a first electrode 131, a second electrode 191, and a common electrode 165.

The first conductive type semiconductor layer 130, the first active layer 140, and the second conductive type semiconductor layer 150 constitute a first light-emitting structure A, and the third conductive type semiconductor layer 170, the second active layer 180, and the fourth conductive type semiconductor layer 190 may constitute a second light-emitting structure B.

The light-emitting device 100 may receive an AC power from an external AC power source to generate continuous light. The AC power source alternately supplies a positive (+) voltage and a negative (−) voltage to the light-emitting device 100. The first light-emitting structure A may emit light by the positive (+) voltage and the negative (−) voltage, and the second light-emitting structure B may emit light by the positive (+) voltage and the negative (−) voltage to continuously generate light.

Hereinafter, components of the light-emitting device 100 will be described in detail.

The substrate 110 may include at least one selected from the group consisting of sapphire ($Al_2O_3$), SiC, GaAs, GaN, ZnO, Si, GaP, InP, and Ge, but is not limited thereto.

The base layer 120 may be disposed on the substrate 110. The base layer 120 may reduce a lattice constant difference between the substrate 110 and the first conductive type semiconductor layer 130 to allow the first conductive type semiconductor layer 130 to be grown with good crystalline.

For example, the base layer 120 may include a plurality of layers including at least one of a buffer layer and an undoped semiconductor layer. Also, the base layer 120 may be formed of a semiconductor material having a compositional formula of $In_xAl_yGa_{1-x-y}N$ ($0 \leq x \leq 1$, $0 \leq y \leq 1$, $0 \leq x+y \leq 1$), but is not limited thereto.

The first light-emitting structure A may be disposed on the base layer 120. The first light-emitting structure A may include the first conductive type semiconductor layer 130, the first active layer 140 on the first conductive type semiconductor layer 130, and the second conductive type semiconductor layer 150 on the first active layer 140.

For example, the first conductive type semiconductor layer 130 may be an N-type semiconductor layer. The N-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlN, InN, and AlInN. The N-type semiconductor layer may be doped with an N-type dopant such as Si, Ge, Sn, or C.

The first active layer 140 may be disposed on the first conductive type semiconductor layer 130. The first active layer 140 may have a single quantum well structure or a multi quantum well (MQW) structure. The first active layer 140 may emit light using carriers (electrons and holes) supplied by the first and second conductive type semiconductor layers 130 and 150.

For example, the first active layer 140 may be formed of a semiconductor material having a compositional formula of $In_xAl_yGa_{1-x-y}N$ ($0 \leq x \leq 1$, $0 \leq y \leq 1$, $0 \leq x+y \leq 1$).

The second conductive type semiconductor layer 150 may be disposed on the first active layer 140. For example, the second conductive type semiconductor layer 150 may be a P-type semiconductor layer. The P-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlN, and InN. The P-type semiconductor layer may be doped with a P-type dopant such as Mg, Zn, Ca, Sr, or Ba.

Also, an N-type clad layer (not shown) may be disposed under the first active layer 140, i.e., between the first conductive type semiconductor layer 130 and the first active layer 140. Also, a P-type clad layer (not shown) may be disposed on the first active layer 140, i.e., between the first active layer 140 and the second conductive type semiconductor layer 150. Each of the clad layers may be formed of one of AlGaN or InAlGaN.

The insulation layer 160 may be disposed on the second conductive type semiconductor layer 150. That is, the insulation layer 160 may be disposed between the second conductive type semiconductor layer 150 and the third conductive type semiconductor layer 170, i.e., between the first light-emitting structure A and the second light-emitting structure B.

The insulation layer 160 may be formed of a semiconductor material having a compositional formula of $In_xAl_yGa_{1-x-y}N$ ($0 \leq x \leq 1$, $0 \leq y \leq 1$, $0 \leq x+y \leq 1$), but is not limited thereto.

Since the insulation layer 160 has a carrier concentration significantly less than those of the first, second, third, and fourth conductive type semiconductor layers 130, 150, 170, and 190, for example, a carrier concentration of less than about $10^{16}$ $cm^{-2}$, a current does not substantially flow. Thus, the insulation layer 160 may insulate the first light-emitting structure A from the second light-emitting structure B.

For example, the insulation layer 160 may have a thickness of about 10 nm to about 1,000 nm. When the insulation layer 160 has a thickness of less than about 10 nm, a leakage current may occur between the first light-emitting structure A and the second light-emitting structure B by a tunneling phenomenon. As a result, the light-emitting device 100 may be abnormally operated. Also, when the insulation layer 160 has a thickness of greater than about 1,000 nm, a thickness of the common electrode 165 commonly contacting the second and third conductive type semiconductor layers 150 and 170 may be increased. As a result, there are limitations that a process for forming the common electrode 165 may be difficult and complicated.

The second light-emitting structure B may be disposed on the insulation layer 160. The second light-emitting structure B may include the third conductive type semiconductor layer 170, the second active layer 180 on the third conductive type semiconductor layer 170, and the fourth conductive type semiconductor layer 190 on the second active layer 180.

For example, the third conductive type semiconductor layer 170 may be an N-type semiconductor layer. The N-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlN, and InN. The N-type semiconductor layer may be doped with an N-type dopant such as Si, Ge, Sn, or C.

The second active layer 180 may be disposed on the third conductive type semiconductor layer 170. The second active layer 180 may have a single quantum well structure or a multi quantum well (MQW) structure. The second active layer 180 may generate light using carriers (electrons and holes) supplied by the third and fourth conductive type semiconductor layers 170 and 190.

For example, the second active layer 180 may be formed of a semiconductor material having a compositional formula of $In_xAl_yGa_{1-x-y}N$ ($0 \leq x \leq 1$, $0 \leq y \leq 1$, $0 \leq x+y \leq 1$).

The fourth conductive type semiconductor layer 190 may be disposed on the second active layer 180. For example, the fourth conductive type semiconductor layer 190 may be a P-type semiconductor layer. The P-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlN, and InN. The P-type semiconductor layer may be doped with a P-type dopant such as Mg, Zn, Ca, Sr, or Ba.

Also, an N-type clad layer (not shown) may be disposed under the second active layer 180, i.e., between the third conductive type semiconductor layer 170 and the second active layer 180. Also, a P-type clad layer (not shown) may be disposed on the second active layer 180, i.e., between the second active layer 180 and the fourth conductive type semiconductor layer 190. Each of the clad layers may be formed of one of AlGaN or InAlGaN.

The first and third conductive type semiconductor layers 130 and 170 may be used as a P-type semiconductor layer doped with the P-type dopant, and the second and fourth conductive type semiconductor layers 150 and 190 may be used as an N-type semiconductor layer doped with the N-type dopant, but are not limited thereto.

The base layer 120, the first light-emitting structure A, the insulation layer 160, and the second light-emitting structure B may be formed using one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

The common electrode 165 may be electrically connected to the second conductive type semiconductor layer 150 and the third conductive type semiconductor layer 170. That is, the common electrode 165 may be electrically connected to both the first light-emitting structure A and the second light-emitting structure B.

For example, as shown in FIG. 1, the common electrode 165 may be disposed on at least one portion of a side surface of the third conductive type semiconductor layer 170 and a side surface of the insulation layer 160 and at least portions of top and side surfaces of the second conductive type semiconductor layer 150.

Also, as shown in FIG. 2, the common electrode 165 may surround at least three side surfaces of four side surfaces of each of the third conductive type semiconductor layer 170, the insulation layer 160, and the second conductive type semiconductor layer 150 to improve a current spreading effect of the light-emitting device 100. However, the common electrode 165 is not limited to a configuration thereof.

A mesa etching process may be performed on the light-emitting device 100 to expose the second conductive type semiconductor layer 150, thereby forming the common electrode 165, but is not limited thereto.

Since the common electrode 165 is electrically connected to an external terminal having an electrical ground state through a third wire 166, the second conductive type semiconductor layer 150 and the third conductive type semiconductor layer 170 may become ground states by the common electrode 165.

The common electrode 165 may include at least one selected from the group consisting of Cu, Au, Al, Ti, and Cr through a deposition process or/and a plating process.

The first electrode 131 may be disposed on the first conductive type semiconductor layer 130, and the second electrode 191 may be disposed on the fourth conductive type semiconductor layer 190. A mesa etching process may be performed on the light-emitting device 100 to expose the first conductive type semiconductor layer 130, thereby forming the first electrode 131.

The first and second electrodes 131 and 191 may include at least one selected from the group consisting of Cu, Au, Al, Ti, and Cr through a deposition process or/and a plating process.

The first electrode 131 provides a power to the first light-emitting structure A, and the second electrode 191 provides a power to the second light-emitting structure B.

The first electrode 131 and the second electrode 191 may be electrically connected to the same AC power source. For example, the first electrode 131 and the second electrode 191 may be connected to a first wire 132 and a second wire 192, respectively. Here, the same AC power may be supplied to the first and second wires 132 and 192 at the same time.

The AC power may have a peak-to-peak voltage adequate for operating the light-emitting device 100. For example, when the light-emitting device 100 has an operation voltage of about 3.3 V, the external AC power source may have a peak-to-peak voltage of about −3.3 V to about 3.3 V. However, the present disclosure is not limited thereto.

Thus, when the AC power source supplies a negative (−) voltage to the first and second electrodes 131 and 191, a light may only be emitted from the first light-emitting structure A. Also, when the AC power source supplies a positive (+) voltage to the first and second electrodes 131 and 191, a light may only be emitted from the first light-emitting structure B. Thus, since the first and second light-emitting structures A and B may alternately emit the light, the light-emitting device 100 may continuously generate light.

Also, since the light-emitting device 100 may emit light using both the positive (+) voltage and the negative (−) voltage, a risk of damage due to a reverse current as described in the existing light-emitting device may be reduced.

The AC power may be supplied to the common electrode 165, and the first and second electrodes 131 and 191 may become ground states, but are not limited thereto.

Figure 3:
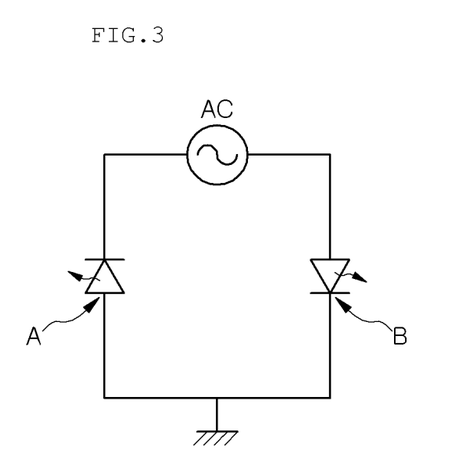
FIG. 3 is a schematic equivalent circuit diagram illustrating the light-emitting device of FIG. 1.

FIG. 3 is a schematic equivalent circuit diagram illustrating the light-emitting device of FIG. 1.

Referring to FIG. 3, each of the first and second light-emitting structures A and B constituting the light-emitting device 100 has one side connected to the AC power source and the grounded other side.

The AC power source alternately supplies the positive (+) voltage and the negative (−) voltage. When the negative (−) voltage is supplied, the first light-emitting structure A may emit light. Also, when the positive (+) voltage is supplied, the second light-emitting structure B may emit light. Thus, the light-emitting device 100 may continuously generate light.

Alternatively, according to a design of the light-emitting device 100, the first light-emitting structure A may emit light when the positive (+) voltage is supplied, and the second light-emitting structure B may emit light when the negative (−) voltage is supplied, but are not limited thereto.

Hereinafter, a process for fabricating the light-emitting device according to the first embodiment will be described. However, the descriptions overlapping with those of the foregoing embodiment will be omitted.

FIGS. 4 to 7 are views illustrating a process for fabricating the light-emitting device according to the first embodiment.

However, the present disclosure is not limited to the process for fabricating the light-emitting device and an order of the process.

Figure 4:
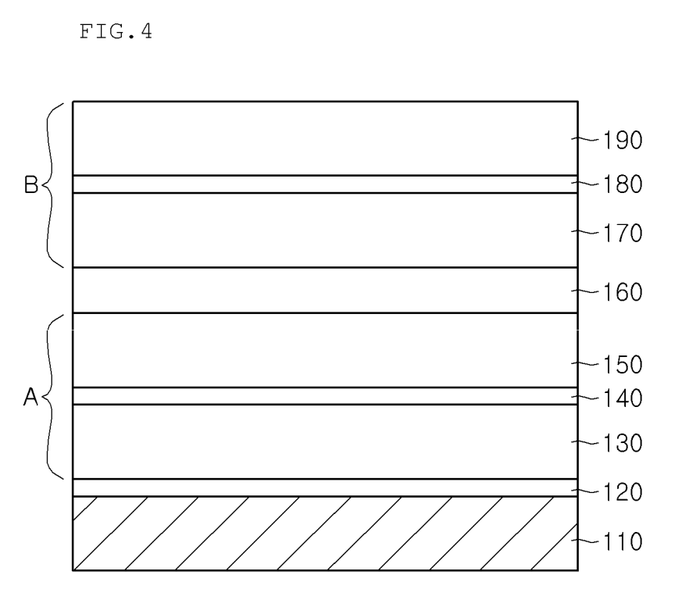
FIGS. 4 to 7 are views illustrating a process for fabricating the light-emitting device according to the first exemplary embodiment.

Referring to FIG. 4, a base layer 120, a first light-emitting structure A, an insulation layer 160, and a second light-emitting structure B may be sequentially formed on a substrate 110.

The first light-emitting structure A may include a first conductive type semiconductor layer 130, a first active layer 140 on the first conductive type semiconductor layer 130, and a second conductive type semiconductor layer 150 on the first active layer 140. The second light-emitting structure B may include a third conductive type semiconductor layer 170, a second active layer 180 on the third conductive type semiconductor layer 170, and a fourth conductive type semiconductor layer 190 on the second active layer 180.

The base layer 120, the first light-emitting structure A, the insulation layer 160, and the second light-emitting structure B may be formed using one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

For example, the base layer 120 may be formed by injecting trimethylalluminum gas (TMAl), trimethylgallium gas (TMGa), ammonia gas ($NH_3$), and hydrogen gas ($N_2$) into a chamber, but is not limited thereto.

For example, the first and third conductive type semiconductor layers 130 and 170 may be formed by injecting TMGa, $NH_3$, $N_2$, and silane gas ($SiH_4$) containing N-type impurities such as silicon (Si) into the chamber, but is not limited thereto.

For example, the first and second active layers 140 and 180 may be formed into a multi quantum well structure having an InGaN/GaN structure by injecting TMGa, $NH_3$, $N_2$, and trimethylindium gas (TMIn) into the chamber, but is not limited thereto.

For example, the second and fourth conductive type semiconductor layers 150 and 190 may be formed by injecting TMGa, $NH_3$, $N_2$, and bis-ethyl-cyclopentadienyl-magnesium ($EtCp_2Mg$){$Mg(C_2H_5C_5H_4)_2$} containing P-type impurities such as magnesium (Mg) into the chamber, but is not limited thereto.

For example, the insulation layer 160 may be formed by injecting TMGa, $NH_3$, and $N_2$ into the chamber, but is not limited thereto.

Figure 5:
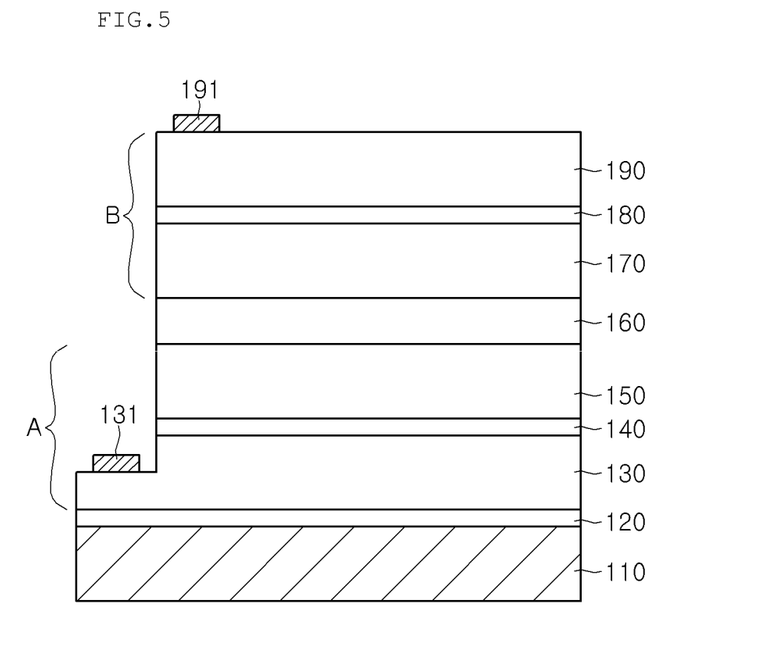

Referring to FIG. 5, a mesa etching process may be performed to expose the first conductive type semiconductor layer 130, a first electrode 131 may be formed on the first conductive type semiconductor layer 130, and a second electrode 191 may be formed on the fourth conductive type semiconductor layer 190.

Figure 6:
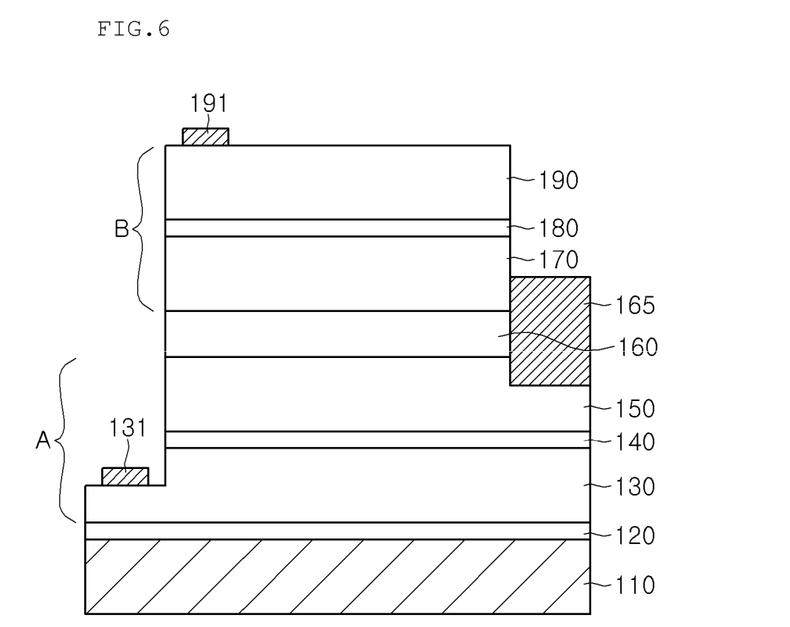

Referring to FIG. 6, a mesa etching process may be performed to expose the second conductive type semiconductor layer 150, and a common electrode 165 may be commonly and electrically connected to the second conductive type semiconductor layer 150, the insulation layer 160, and the third conductive type semiconductor layer 170.

For example, as shown in FIG. 6, the common electrode 165 may be disposed on at least one portion of a side surface of the third conductive type semiconductor layer 170 and a side surface of the insulation layer 160 and at least portions of top and side surfaces of the second conductive type semiconductor layer 150.

Figure 7:
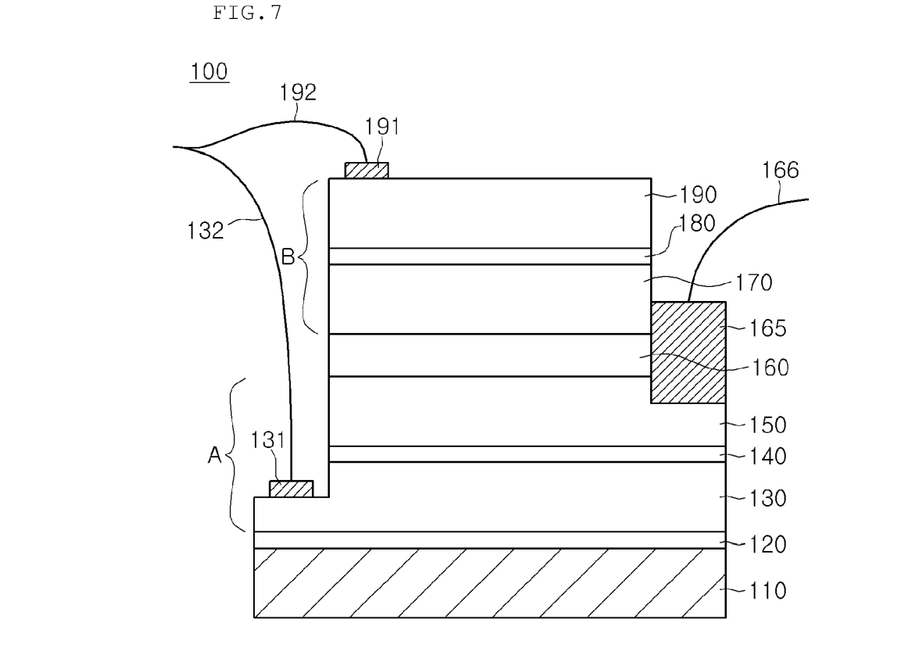

Referring to FIG. 7, the first and second electrodes 131 and 191 may be connected to first and second wires 132 and 192, respectively. Also, a third wire 166 may be connected to the common electrode 165 to connect the light-emitting device 100 to an external AC power source. An AC power may be supplied to the first and second electrodes 131 and 191, and the common electrode 165 may become a ground state.

Thus, the light-emitting device 100 according to the first embodiment may receive AC power to continuously emit light.

Hereinafter, a light-emitting device according to a second exemplary embodiment and a process for fabricating the same will be described in detail. In description of the second embodiment, the same part as those of the first embodiment will be described with reference to the first embodiment and their duplicated descriptions will be omitted.

Figure 8:
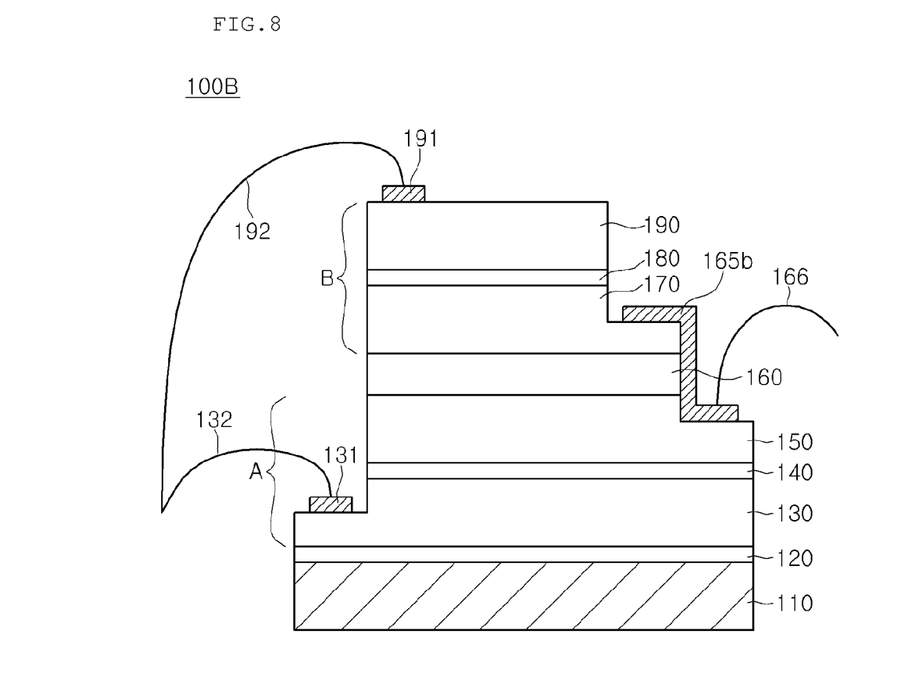
FIG. 8 is a sectional view of a light-emitting device according to a second exemplary embodiment.

The light-emitting device according to the second embodiment may be equal to the light-emitting device according to the first embodiment except a configuration of a common electrode.

FIG. 8 is a sectional view of a light-emitting device according to a second exemplary embodiment.

Referring to FIG. 8, a light-emitting device 100B may include a substrate 110, a base layer 120 on the substrate 110, a first light-emitting structure A on the base layer 120, an insulation layer 160 on the first light-emitting structure A, a second light-emitting structure B on the insulation layer 160, a first electrode 131 supplying a power to the first light-emitting structure A, a second electrode 191 supplying a power to the second light-emitting structure B, and a common electrode 165b electrically connecting the first and second light-emitting structures A and B to an external terminal having a ground state.

The common electrode 165b may be disposed on top and side surfaces of a third conductive type semiconductor layer 170, a side surface of the insulation layer 160, and top and side surfaces of a second conductive type semiconductor layer 150.

A mesa etching process may be performed on the light-emitting device 100B to expose the second conductive type semiconductor layer 150 and the third conductive type semiconductor layer 170, thereby forming the common electrode 165b, but is not limited thereto.

Also, the common electrode 165b may be designed in various shapes to improve a current spreading effect of the light-emitting device 100B, but is not limited thereto.

Hereinafter, a light-emitting device according to a third exemplary embodiment and a process for fabricating the same will be described in detail. In description of the third embodiment, the same part as those of the first embodiment will be described with reference to the first embodiment and their duplicated descriptions will be omitted.

Figure 9:
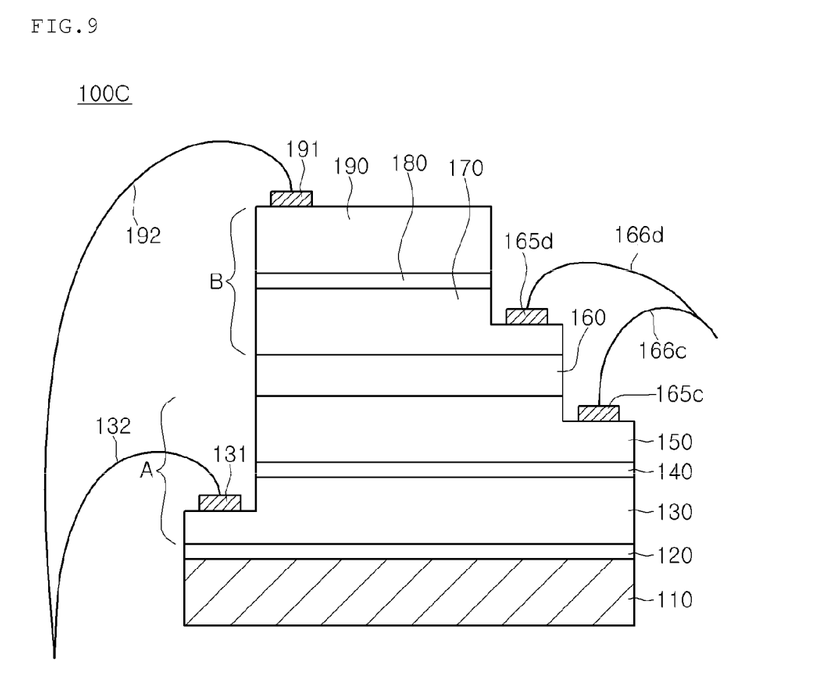
FIG. 9 is a sectional view of a light-emitting device according to a third exemplary embodiment.

The light-emitting device according to the third embodiment is equal to the light-emitting device according to the first embodiment except a configuration of a common electrode.

FIG. 9 is a sectional view of a light-emitting device according to a third exemplary embodiment.

Referring to FIG. 9, a light-emitting device 100C may include a substrate 110, a base layer 120 on the substrate 110, a first light-emitting structure A on the base layer 120, an insulation layer 160 on the first light-emitting structure A, a second light-emitting structure B on the insulation layer 160, a first electrode 131 supplying a power to the first light-emitting structure A, a second electrode 191 supplying a power to the second light-emitting structure B, and first and second common electrodes 165c and 165d electrically connecting the first and second light-emitting structures A and B to an external terminal having a ground state.

The first common electrode 165c may be disposed on a second conductive type semiconductor layer 150. Also, the second common electrode 165d may be disposed on a third conductive type semiconductor layer 170.

For example, the first and second common electrodes 165c and 165d may be electrically connected to the external terminal having the ground state by fourth and fifth wires 166c and 166d, respectively, but is not limited thereto.

Hereinafter, a light-emitting device according to a fourth exemplary embodiment and a process for fabricating the same will be described in detail. In description of the fourth embodiment, the same part as those of the first embodiment will be described with reference to the first embodiment and their duplicated descriptions will be omitted.

Figure 10:
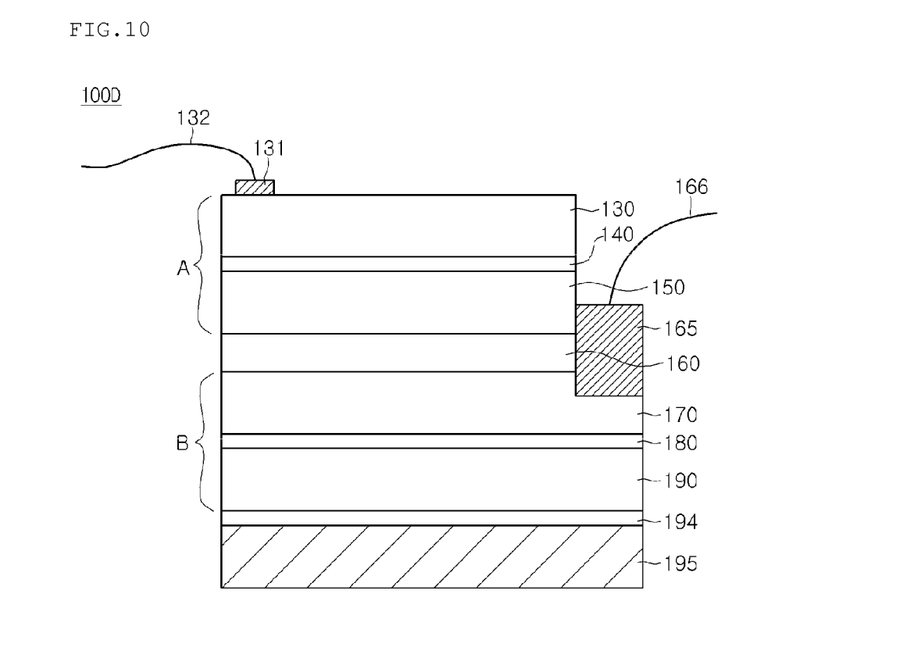
FIG. 10 is a sectional view of a light-emitting device according to a fourth exemplary embodiment.

The light-emitting device according to the fourth embodiment may be equal to the light-emitting device according to the first embodiment except that a vertical type light-emitting device in which an electrode is vertically disposed may be provided.

FIG. 10 is a sectional view of a light-emitting device according to a fourth exemplary embodiment.

Referring to FIG. 10, a light-emitting device 100D may include a conductive support member 195 having conductivity, a reflective layer 194 on the conductive support member 195, a second light-emitting structure B on the reflective layer 194, an insulation layer 160 on the second light-emitting structure B, a first light-emitting structure on the insulation layer 160, an electrode 131 on the first light-emitting structure A, and a common electrode 165 electrically connecting the first and second light-emitting structures A and B to an external terminal having a ground state. An AC power source may be commonly and electrically connected to the electrode 131 and the conductive support member 195.

The second light-emitting structure B may include a fourth conductive type semiconductor layer 190, a second active layer 180 on the fourth conductive type semiconductor layer 190, and a third conductive type semiconductor layer 170 on the second active layer 180.

The first light-emitting structure A may include a second conductive type semiconductor layer 150 on the insulation layer 160, a first active layer 140 on the second conductive type semiconductor layer 150, and a first conductive type semiconductor layer 130 on the first active layer 140.

The common electrode 165 may be disposed on at least one portion of a side surface of the second conductive type semiconductor layer 150, a side surface of the insulation layer 160, and at least one portion of top and side surfaces of the third conductive type semiconductor layer 170.

The conductive support member 195 together with the first electrode 131 may provide an AC power to the light-emitting device 100D. That is, the conductive support member 195 and the first electrode 131 may be commonly connected the AC power source to receive the same AC power from the outside.

The conductive support member 195 may include at least one selected from the group consisting of Ti, Cr, Ni, Al, Pt, Au, W, Cu, and Mo, or may be a semiconductor substrate in which impurities are injected.

The reflective layer 194 may include at least one selected from the group consisting of Ag, Al, Pt, and Pd.

In the light-emitting device 100 of FIG. 1, the reflective layer 194 and the conductive support member 195 may be formed on the second light-emitting structure B. Then, the base layer and the substrate (not shown) attached to the first light-emitting structure A may be removed to form the first electrode 131 on the first conductive type semiconductor layer 130, thereby manufacturing the light-emitting device 100D.

Hereinafter, a light-emitting device according to a fifth embodiment and a process for fabricating the same will be described in detail. In description of the fifth embodiment, the same part as those of the first embodiment will be described with reference to the first embodiment and their duplicated descriptions will be omitted.

Figure 11:
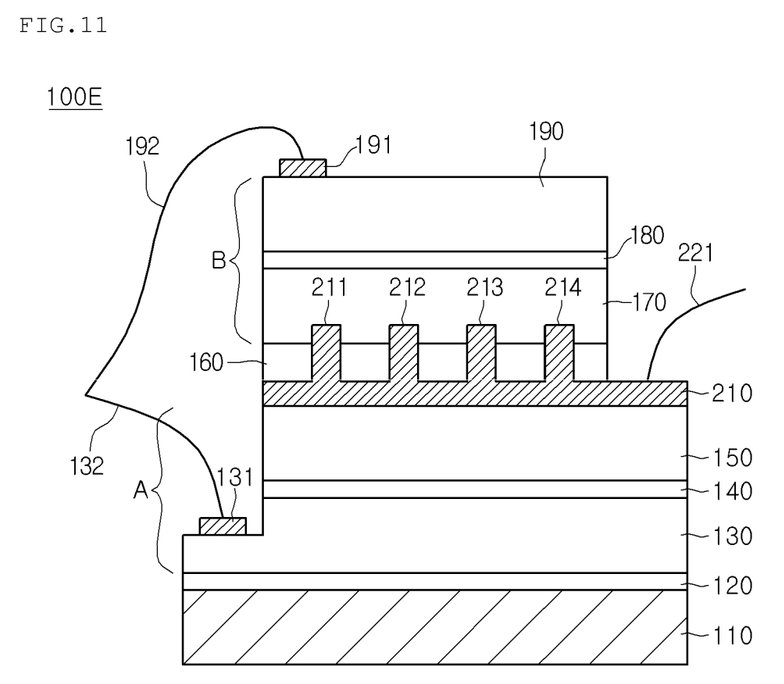
FIG. 11 is a sectional view of a light-emitting device according to a fifth exemplary embodiment.

The light-emitting device according to the fifth embodiment may be equal to the light-emitting device according to the first embodiment except that a common electrode 210 is disposed between an insulation layer 150 and a first light-emitting structure A, and a plurality of common electrodes 211, 212, 213, and 214 contact a second light-emitting structure B passing through the insulation layer 150.

FIG. 11 is a sectional view of a light-emitting device according to a fifth exemplary embodiment.

Referring to FIG. 11, a light-emitting device 100E according to a fifth embodiment may include a substrate 110, a base layer 120, a first conductive type semiconductor layer 130, a first active layer 140, a second conductive type semiconductor layer 150, a common electrode layer 210, an insulation layer 160, a third conductive type semiconductor layer 170, a second active layer 180, a fourth conductive type semiconductor layer 190, a first electrode 131, and a second electrode 191.

The first conductive type semiconductor layer 130, the first active layer 140, and the second conductive type semiconductor layer 150 may constitute a first light-emitting structure A, and the third conductive type semiconductor layer 170, the second active layer 180, and the fourth conductive type semiconductor layer 190 may constitute a second light-emitting structure B.

The common electrode layer 210 may be disposed on a top surface of the second conductive type semiconductor layer 150 of the first light-emitting structure A. The common electrode layer 210 may be disposed on an entire region of the second conductive type semiconductor layer 150. That is, the common electrode layer 210 may have the same area as that of the second conductive type semiconductor layer 150. Thus, the first light-emitting structure A may emit light by the first electrode 131 and the common electrode layer 210. Since the common electrode layer 210 may have the same area as the second conductive type semiconductor layer 150, a current supplied into the common electrode layer 210 may flow into an entire region of the common electrode layer 210. Thus, the current flowing into the entire region of the common electrode layer 210 may flow into the second conductive type semiconductor layer 150 contacting the common electrode layer 210 with the same area. Therefore, uniform light may be emitted from an entire region of the active layer 140 by the spreading current flowing into the entire region of the second conductive type semiconductor layer 150.

The common electrode layer 210 may include a plurality of upwardly protruding common electrodes 211, 212, 213, and 214. The common electrodes 211, 212, 213, and 214 may pass through the insulation layer 160 to contact the third conductive type semiconductor layer 170 of the second light-emitting structure B.

The common electrodes 211, 212, 213, and 214 may be spaced from each other with a predetermined distance or random distance.

The common electrodes 211, 212, 213, and 214 may have top surfaces having the same height as that of a top surface of the insulation layer 160. Alternatively, the top surfaces may have heights greater than that of the top surface of the insulation layer 160.

Thus, at least portions of top and side surfaces of the common electrodes 211, 212, 213, and 214 may contact the third conductive type semiconductor layer 170 of the second light-emitting structure B.

The top surfaces of the common electrodes 211, 212, 213, and 214 may have heights equal to or greater than that of the insulation layer 160 and heights at least less than that of the third conductive type semiconductor layer 170 of the second light-emitting structure B. That is, the common electrodes 211, 212, 213, and 214 may be positioned between a bottom surface of the third conductive type semiconductor layer 170 and a top surface of the third conductive type semiconductor layer 170 contacting the second active layer 180.

The side and top surfaces of each of the common electrodes 211, 212, 213, and 214 may contact the third conductive type semiconductor layer 170.

The common electrodes 211, 212, 213, and 214 may protrude from the common electrode layer 210. Alternatively, the common electrodes 211, 212, 213, and 214 may be formed of a material different from that of the common electrode layer 210 and individually formed from the common electrode layer 210. In this case, the electrodes 211, 212, 213, and 214 may electrically contact the common electrode layer 210.

A metal layer may be patterned by a predetermined depth using one etching process of a dry etching process and a wet etching process to form the common electrodes 211, 212, 213, and 214 and the common electrode layer 210 at the same time.

The common electrode layer 210 and the common electrodes 211, 212, 213, and 214 may include at least one selected from the group consisting of Ti, Cr, Ni, Al, Pt, Au, W, Cu, and Mo, and combinations thereof.

An edge region of a side of the common electrode layer 210 may be exposed to the outside. Thus, a third wire 221 may be directly connected to the exposed edge region. Therefore, a voltage (or current) supplied into the third wire 221 may be spread into the entire region of the common electrode layer 210 to flow into the plurality of common electrodes 211, 212, 213, and 214 connected to the common electrode layer 210.

The fifth embodiment may be identically applied to the light-emitting structure (vertical LED) of the fourth embodiment (FIG. 10). That is, the common electrode layer may be disposed between the third conductive type semiconductor layer 170 and the insulation layer 160, and the plurality of common electrodes 211, 212, 213, and 214 passes through the insulation layer 160 to contact the second conductive type semiconductor layer 150.

Figure 12:
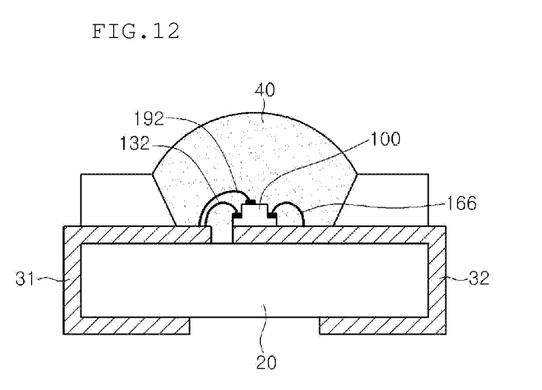
FIG. 12 is a sectional view of a light-emitting device package including a light-emitting device according to an exemplary embodiment.

FIG. 12 is a sectional view of a light-emitting device package including a light-emitting device according to an exemplary embodiment.

Referring to FIG. 12, a light-emitting device package may include a body part 20, first and second electrode layers 31 and 32 disposed on the body part 20, a light-emitting device 100 disposed on the body part 20 and electrically connected to the first and second electrode layers 31 and 32, and a molding member 40 surrounding the light-emitting device 100.

The body part 20 may be formed of a silicon material, a synthetic resin material, or a metal material. An inclined surface may be disposed around the light-emitting device 100.

The first electrode layer 31 and the second electrode layer 32 may be electrically separated from each other and provide an AC power to the light-emitting device 100. Also, the first and second electrode layers 31 and 32 may reflect light generated in the light-emitting device 100 to improve light efficiency. In addition, the first and second electrode layers 31 and 32 may discharge heat generated in the light-emitting device 100 to the outside.

The light-emitting device 100 may be disposed on the body part 20 or the first or second electrode layer 31 or 32.

First and second wires 132 and 192 of the light-emitting device 100 may be electrically connected to one of the first electrode layer 31 and the second electrode layer 32, and a third wire 166 may be electrically connected to the other one of the first electrode layer 31 and the second electrode layer 32, but are not limited thereto.

The molding member 40 may surround the light-emitting device 100 to protect the light-emitting device 100. Also, a phosphor may be contained in the molding member 40 to change a wavelength of light emitted from the light-emitting device 100.

The light-emitting device package according to an embodiment may be applicable to a lighting unit. The lighting unit may have a structure in which a plurality of light-emitting devices or light-emitting device packages is arrayed. Thus, the lighting unit may include the display device illustrated in FIGS. 13 and 14 and the lighting device illustrated in FIG. 15. In addition, the lighting unit may include illumination lamps, traffic lights, vehicle headlights, and signs.

Figure 13:
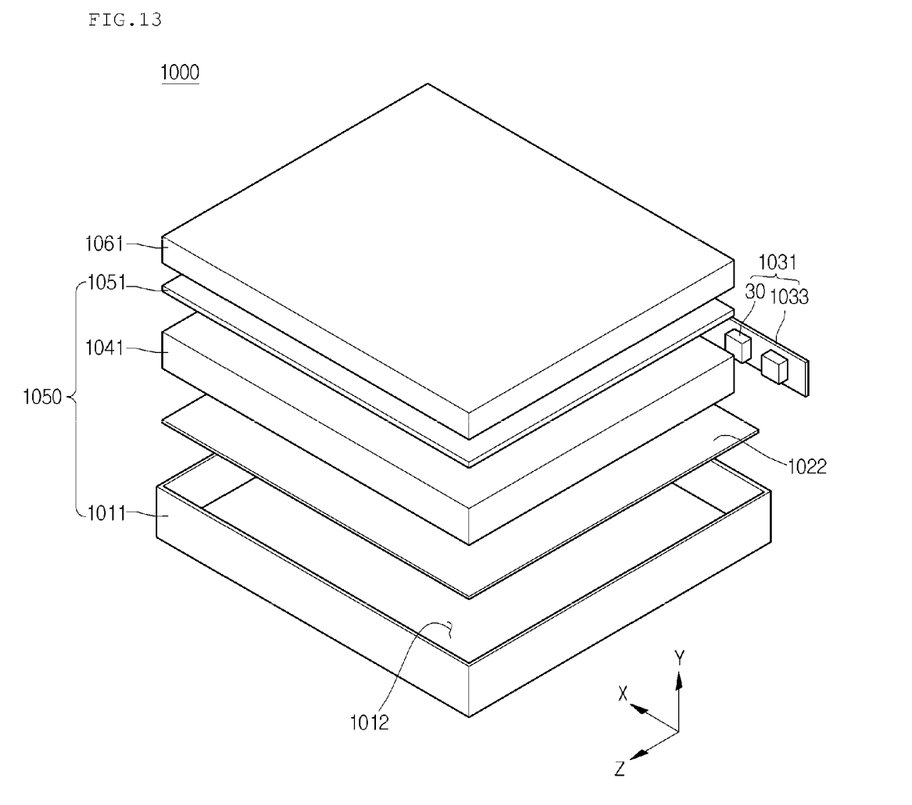
FIG. 13 is an exploded perspective view of a display device according to an exemplary embodiment.

FIG. 13 is an exploded perspective view of a display device according to an exemplary embodiment.

Referring to FIG. 13, a display device 1000 may include a light guide plate 1041, a light-emitting module 1031 providing light to the light guide plate 1041, a reflective member 1022 under the light guide plate 1041, an optical sheet 1051 above the light guide plate 1041, a display panel 1061 above the optical sheet 1051, and a bottom cover 1011 receiving the light guide plate 1041, the light-emitting module 1031, and the reflective member 1022, but is not limited thereto.

The bottom cover 1011, the reflective member 1022, the light guide plate 1041, and the optical sheet 1051 may be defined as the light unit 1050.

The light guide plate 1041 may diffuse light provided from the light-emitting module 1031 to produce planar light. The light guide plate 1041 may be formed of a transparent material, e.g., one of an acrylic resin-based material such as polymethyl metaacrylate (PMMA), a polyethylene terephthalate (PET) resin, a poly carbonate (PC) resin, a cycloolefin copolymer (COC) resin, and a polyethylene naphthalate (PEN) resin.

The light-emitting module 1031 may be disposed on at least one side surface of the light guide plate 1041 to provide light on at least one side surface of the light guide plate 1041. Thus, the light-emitting module 1031 may be used as a light source of the display device.

At least one light-emitting module 1031 may be disposed on one side surface of the light guide plate 1041 to directly or indirectly provide light. The light-emitting module 1031 may include a board 1033 and the light-emitting device packages 30 according to the above-described embodiments. The light-emitting device packages 30 may be arrayed on the board 1033 by a predetermined distance. The board 1033 may be a printed circuit board (PCB), but is not limited thereto. Also, the board 1033 may include a metal core PCB (MCPCB) and a flexible PCB (FPCB), but is not limited thereto. When the light-emitting device packages 30 are mounted on a side surface of the bottom cover 1011 or on a heatsink plate, the board 1033 may be removed. Here, a portion of the heatsink plate may contact a top surface of the bottom cover 1011. Thus, heat generated in the light-emitting device packages 30 may be discharged through the bottom cover 1011 via the heatsink plate.

The plurality of light-emitting device packages 30 may be mounted on the board 1033 to allow a light-emitting surface through which light is emitted to be spaced a predetermined distance from the light guide plate 1041, but is not limited thereto. The light-emitting device packages 30 may directly or indirectly provide light to a light incident surface that is a side surface of the light guide plate 1041, but is not limited thereto.

The reflective member 1022 may be disposed under the light guide plate 1041. The reflective member 1022 reflects light incident through an under surface of the light guide plate 1041 to supply the light to the display panel 1061, thereby improving brightness of the display panel 1061. For example, the reflective member 1022 may be formed of one of PET, PC, and PVC, but is not limited thereto. The reflective member 1022 may be the top surface of the bottom cover 1011, but is not limited thereto.

The bottom cover 1011 may receive the light guide plate 1041, the light-emitting module 1031, and the reflective member 1022. For this, the bottom cover 1011 may include a receiving part 1012 having a box shape with a top surface opened, but is not limited thereto. The bottom cover 1011 may be coupled to a top cover, but is not limited thereto.

The bottom cover 1011 may be formed of a metal material or a resin material. Also, the bottom cover 1011 may be manufactured using a press molding process or an extrusion molding process. The bottom cover 1011 may be formed of a metal or non-metal material having superior heat conductivity, but is not limited thereto.

For example, the display panel 1061 may be a liquid crystal display (LCD) panel and include first and second boards formed of a transparent material and a liquid crystal layer between the first and second boards. A polarizing plate may be attached to at least one surface of the display panel 1061. The present disclosure is not limited to the attached structure of the polarizing plate. The display panel 1061 may transmit or blocks light provided from the light-emitting module 1031 to display information. The display unit 1000 may be applied to various portable terminals, monitors for notebook computers, monitors for laptop computers, televisions, etc.

The optical sheet 1051 may be disposed between the display panel 1061 and the light guide plate 1041 and includes at least one or more light-transmitting sheets. For example, the optical sheet 1051 may include at least one of sheets such as a diffusion sheet, a horizontal or vertical prism sheet, and a brightness enhancement sheet. The diffusion sheet diffuses incident light, and the horizontal or/and vertical prism sheet(s) collect(s) the incident light into the display panel 1061. Also, the brightness enhancement sheet may reuse lost light to improve the brightness. Also, a protection sheet may be disposed on the display panel 1061, but is not limited thereto.

Optical members such as the light guide plate 1041 and the optical sheet 1051 may be disposed on an optical path of the light-emitting module 1031, but is not limited thereto.

Figure 14:
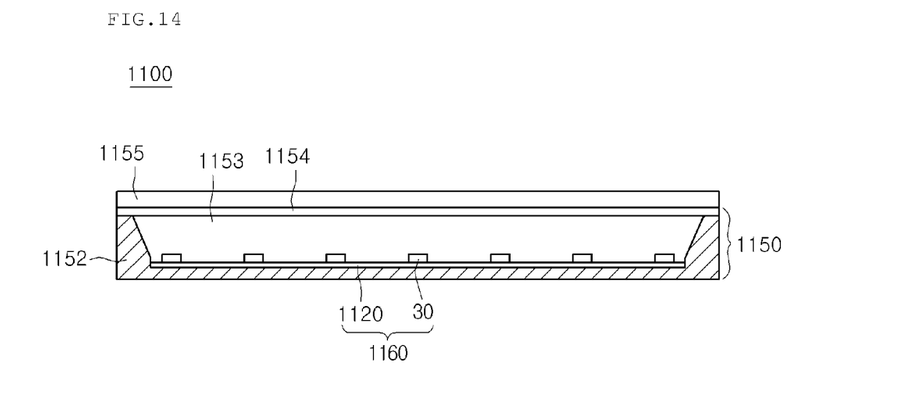
FIG. 14 is a view of a display device according to an exemplary embodiment.

FIG. 14 is a view of a display device according to an exemplary embodiment.

Referring to FIG. 14, a display unit 1100 may include a bottom cover 1152, a board 1120 on which the above-described light-emitting device packages 30 are arrayed, an optical member 1154, and a display panel 1155.

The board 1120 and the light-emitting device packages 30 may be defined as the light-emitting module 1060. The bottom cover 1152, at least one light-emitting module 1060, and the optical member 1154 may be defined as a lighting unit (not shown).

The bottom cover 1152 may include a receiving part 1153, but is not limited thereto.

Here, the optical member 1154 may include at least one of a lens, a light guide plate, a diffusion sheet, horizontal and vertical prism sheets, and a brightness enhancement sheet. The light guide plate may be formed of a PC material or poly methy methacrylate (PMMA) material. In this case, the light guide plate may be removed. The diffusion sheet diffuses incident light, and the horizontal and vertical prism sheets collect the incident light into the display panel 1155. The brightness enhancement sheet may reuse lost light to improve brightness.

The optical member 1154 may be disposed on the light-emitting module 1060. Thus, light emitted from the light-emitting module 1060 may be planarized, diffused, or collected.

Figure 15:
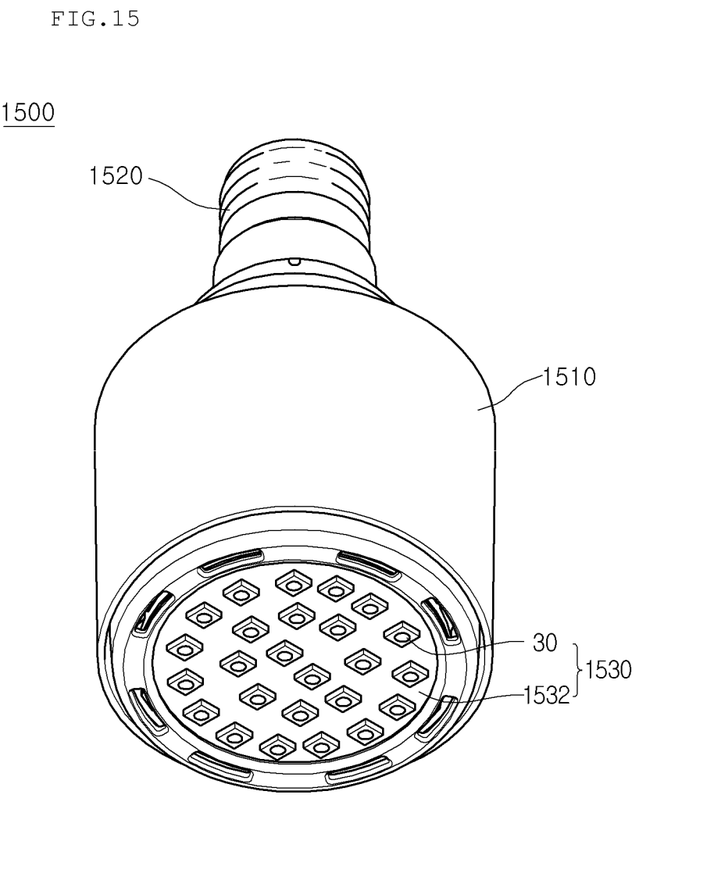
FIG. 15 is a perspective view of a lighting device according to an exemplary embodiment.

FIG. 15 is a perspective view of a lighting device according to an exemplary embodiment.

Referring to FIG. 15, the lighting unit 1500 may include a case 1510, a light-emitting module 1530 in the case 1510, and a connection terminal 1520 disposed in the case 1510 to receive a power from an external power source.

The case 1510 may be preferably formed of a material having good heat dissipation characteristics, for example, a metal material or a resin material.

The light-emitting module 1530 may include a board 1532 and a light-emitting device package 30 mounted on the board 1532. The light-emitting device package 30 may be provided in plurality, and the plurality of light-emitting device packages 30 may be arrayed in a matrix shape or spaced a predetermined distance from each other.

The board 1532 may be an insulator on which a circuit pattern is printed. For example, the board may include a general printed circuit board (PCB), a metal core PCB, a flexible PCB, a ceramic PCB, FR-4, etc.

Also, the board 1532 may be formed of a material to efficiently reflect light, and a surface thereof may be formed in a color capable of efficiently reflecting light. For example, the board 1532 may be a coated layer having a white color or a silver color.

At least one light-emitting device package 30 may be mounted on the board 1532. Each of the light-emitting device packages 30 may include at least one light emitting diode (LED) chip. The LED chip may include an LED emitting light having a visible light band such as red, green, blue or white light or a UV LED emitting ultraviolet (UV) rays.

The light-emitting module 1530 may have a combination of several light-emitting device packages 30 to obtain desired color and brightness. For example, the light-emitting module 1530 may have a combination of a white LED, a red LED, and a green LED to obtain a high color rendering index (CRI).

The connection terminal 1520 may be electrically connected to the light-emitting module 1530 to supply a power. The connection terminal 1520 may be screwed and coupled to an external power source in a socket type, but is not limited thereto. For example, the connection terminal 1520 may be made in a pin type and inserted into an external power source, or may be connected to the external power source through a wire.

A method for fabricating a light-emitting device according to an embodiment may include forming a first light-emitting structure on a substrate; forming an insulation layer on the first light-emitting structure; forming a second light-emitting structure on the insulation layer; and forming a common electrode commonly and electrically connected to the first light-emitting structure and the second light-emitting structure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light-emitting device comprising:
a substrate;
a first light-emitting structure on the substrate, the first light-emitting structure comprising a first conductive type semiconductor layer, a first active layer on the first conductive type semiconductor layer, and a second conductive type semiconductor layer on the first active layer;
an insulation layer on the first light-emitting structure, the insulation layer being disposed on the second conductive type semiconductor layer;
a second light-emitting structure on the insulation layer, the second light-emitting structure comprising a third conductive type semiconductor layer on the insulation layer, a second active layer on the third conductive type semiconductor layer, and a fourth conductive type semiconductor layer on the second active layer; and
a common electrode physically and electrically connected to the second conductive type semiconductor layer and the third conductive type semiconductor layer,
wherein the common electrode contacts the insulation layer,
wherein the common electrode is disposed on at least a portion of top and side surfaces of the second conductive type semiconductor layer, a side surface of the insulation layer, and at least one portion of a side surface of the third conductive type semiconductor layer.

2. The light-emitting device of claim 1, wherein the insulation layer includes a semiconductor material having a low carrier concentration.

3. The light-emitting device of claim 1, further comprising a first electrode on the first conductive type semiconductor layer and a second electrode on the fourth conductive type semiconductor layer.

4. The light-emitting device of claim 1, wherein the common electrode is at least one selected from the group consisting of Cu, Au, Al, Ti, and Cr.

5. The light-emitting device of claim 1, wherein the common electrode is connected to an external terminal having an electrical ground state.

6. The light-emitting device of claim 3, wherein the first and second electrodes are commonly and electrically connected to an AC power source.

7. The light-emitting device of claim 1, wherein the first conductive type semiconductor layer and the third conductive type semiconductor layer comprise an N-type dopant, and the second conductive type semiconductor layer and the fourth conductive type semiconductor layer comprise a P-type dopant.

8. The light-emitting device of claim 1, wherein the insulation layer has a thickness of about 10 nm to about 1,000 nm.

9. A light-emitting device comprising:
a substrate;
a first light-emitting structure on the substrate, the first light-emitting structure comprising a first conductive type semiconductor layer, a first active layer on the first conductive type semiconductor layer, and a second conductive type semiconductor layer on the first active layer, wherein the second conductive type semiconductor layer has a first upper surface and a second upper surface;
an insulation layer on the first light-emitting structure, the insulation layer being disposed on the second conductive type semiconductor layer;
a second light-emitting structure on the insulation layer, the second light-emitting structure comprising a third conductive type semiconductor layer on the insulation layer, a second active layer on the third conductive type semiconductor layer, and a fourth conductive type semiconductor layer on the second active layer; and
a common electrode physically and electrically connected to the second conductive type semiconductor layer and the third conductive type semiconductor layer,
wherein the third conductive type semiconductor layer comprises an N-type dopant,
wherein the second upper surface of the second conductive type semiconductor layer is lower than the first upper surface of the second conductive type semiconductor layer.

10. The light-emitting device of claim 9, wherein the common electrode is disposed on the second upper surface of the second conductive type semiconductor layer.

11. The light-emitting device of claim 9, wherein the insulation layer directly contacts the second upper surface of the second conductive type semiconductor layer.

12. The light-emitting device of claim 9, wherein the insulation layer includes a semiconductor material having a low carrier concentration.

13. The light-emitting device of claim 9, further comprising a first electrode on the first conductive type semiconductor layer and a second electrode on the fourth conductive type semiconductor layer.

14. The light-emitting device of claim 9, wherein the common electrode is at least one selected from the group consisting of Cu, Au, Al, Ti, and Cr.

15. The light-emitting device of claim 9, wherein the common electrode is connected to an external terminal having an electrical ground state.

16. The light-emitting device of claim 9, wherein the first and second electrodes are commonly and electrically connected to an AC power source.

17. The light-emitting device of claim 9, wherein the first conductive type semiconductor layer comprises N-type dopant, and the second conductive type semiconductor layer and the fourth conductive type semiconductor layer comprise a P-type dopant.

18. The light-emitting device of claim 9, wherein the insulation layer has a thickness of about 10 nm to about 1,000 nm.

* * * * *